(12) United States Patent
Scudder et al.

(10) Patent No.: US 6,544,033 B1
(45) Date of Patent: Apr. 8, 2003

(54) WAFER CARRIER

(75) Inventors: Lance A. Scudder, Santa Clara, CA (US); Lori Washington, Union City, CA (US); Lori A. Callaghan, Sunnyvale, CA (US); Bradley M. Curelop, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/658,362

(22) Filed: Sep. 8, 2000

(51) Int. Cl.$^7$ ................................................ F27D 19/00
(52) U.S. Cl. ........................................................ 432/53
(58) Field of Search ...................... 432/253, 53; 451/41, 451/287, 603, 288, 289, 397, 398

(56) References Cited

U.S. PATENT DOCUMENTS

| | | | | |
|---|---|---|---|---|
| 4,419,076 A | * | 12/1983 | Kirshman | 432/253 |
| 5,044,871 A | * | 9/1991 | Davis et al. | 414/786 |
| 5,310,339 A | * | 5/1994 | Ushikawa | 432/253 |
| 5,324,012 A | * | 6/1994 | Aoyama et al. | 269/21 |
| 5,429,251 A | * | 7/1995 | Matthews | 211/41 |
| 5,718,574 A | * | 2/1998 | Shimazu | 432/253 |
| 5,906,754 A | * | 5/1999 | Appel et al. | 216/88 |
| 5,914,053 A | * | 6/1999 | Masumura et al. | 216/88 |
| 5,951,374 A | * | 9/1999 | Kato et al. | 451/41 |
| 6,186,779 B1 | * | 2/2001 | Choi et al. | 432/258 |
| 6,231,428 B1 | * | 5/2001 | Malroney et al. | 451/41 |

OTHER PUBLICATIONS

International Search Report PCT/US 01/27714.

* cited by examiner

*Primary Examiner*—John F. Niebling
*Assistant Examiner*—Olivia Luk
(74) *Attorney, Agent, or Firm*—Blakely Sokoloff Taylor & Zafman

(57) ABSTRACT

Provided herein is a wafer carrier comprising a disk and a pocket, wherein the pocket is centered in the disk and holds a wafer. Also provided is a method of processing or testing a wafer for a semiconductor device, comprising the steps of placing the wafer in the wafer carrier disclosed herein; loading the wafer carrier in a loadlock chamber; and transferring the wafer carrier from the loadlock chamber to a process chamber for processing or testing.

28 Claims, 2 Drawing Sheets

WAFER CARRIER

BACKGROUND OF THE INVENTION

1. Field of the Invention

The present invention relates generally to the field of semiconductor manufacturing. More specifically, the present invention relates to handling of wafers in a wafer testing and/or processing procedure.

2. Description of the Related Art

The manufacture of integrated circuits begins with blank, unpatterned semiconductor wafers. These wafers undergo a number of sometimes critical process steps before being formed into the final integrated circuits form. The percentage of good integrated circuits from a particular fabrication lot is known in the industry as the yield percentage. A substandard wafer can affect the number of usable integrated circuits on a wafer (yield). It is therefore desirable to have a machine for testing wafers to ensure the wafers meet a customer's standards to maximize wafer yield.

The testing of wafers is often accomplished by an automated process, in which robots continuously handle and test the wafers. Robot testing and handling tends to be more efficient than manual testing and handling of wafers, since robots can be much faster, more precise and less contaminating than human operators when handling wafers. In wafer handling processes, wafers are typically transported using carriers such as wafer cassettes and wafer pods. Pods differ from cassettes in that the pods typically are sealed to prevent contamination to the wafers enclosed therein.

Wafer carriers, sometimes known as "boats", contain batches of wafers. These carriers are then used to transport and hold the wafers inside furnaces as well as other equipment. These carriers are usually made of special materials, such as quartz and silicon carbide, which allow them to be used at the elevated temperatures inside furnaces while the wafers are being processed. Depending on the materials that carriers are made of, some of the existing carriers actually can change size over time at elevated temperatures. This can pose a huge problem to wafer handling automation. Additionally, these carriers are also limited in their useful temperature range. In certain processes, some commonly used materials cannot be used because the carrier would deform to an unusable state rather quickly. If the carriers change dimensionally after a period of time due to the stresses of the fabrication processes, they could prove to be unusable in the wafer loading equipment.

Wafers having a diameter of 8 inches are commonly used in the semiconductor industry for the manufacture of integrated circuits. The process chambers are usually configured for the 8" wafers. However, customers sometimes need to use wafers having a diameter smaller than 8" for special purpose. To process wafers smaller than the standard size, the process chamber size would have to be reconfigured. The process of reconfiguration could be time-consuming and risk-taking. Furthermore, the chances of contamination would be increased during the exposure of process chamber and robot to the ambient environment.

Therefore, the prior art is deficient in the lack of an effective method/apparatus for loading smaller diameter wafers or test chips for processing or testing in a standard process chamber without having to reconfigure the chamber size and robot calibrations. The present invention fulfills this long-standing need and desire in the art.

SUMMARY OF THE INVENTION

In one aspect, there is provided a wafer carrier which comprises a disk and a pocket, wherein the pocket is centered in the disk and holds the wafer.

In another aspect, there is provided a method of processing or testing a wafer for a semiconductor device. This method comprises the steps of placing the wafer in the wafer carrier described herein; loading the wafer carrier in a loadlock chamber; and transferring the wafer carrier from the loadlock chamber to a process chamber for processing or testing.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

DETAILED DESCRIPTION OF THE INVENTION

Figure 1:
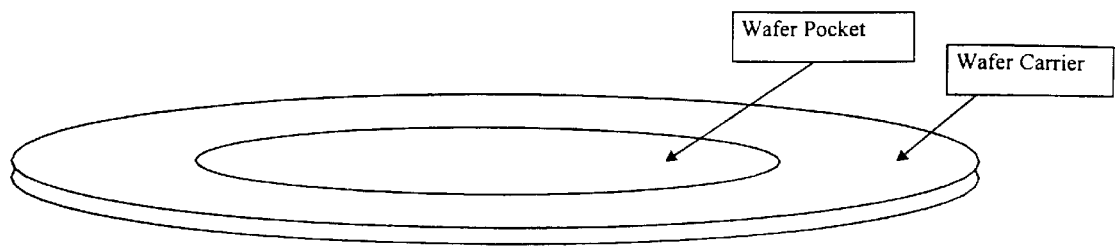
FIG. 1 is a schematic drawing of the wafer carrier system in accordance with one aspect.

Provided herein is a wafer carrier, which comprises a disk machined to the size of a standard wafer and a wafer pocket centered in the disk for holding wafers or test chips for processing or testing (FIG. 1).

Figure 2:
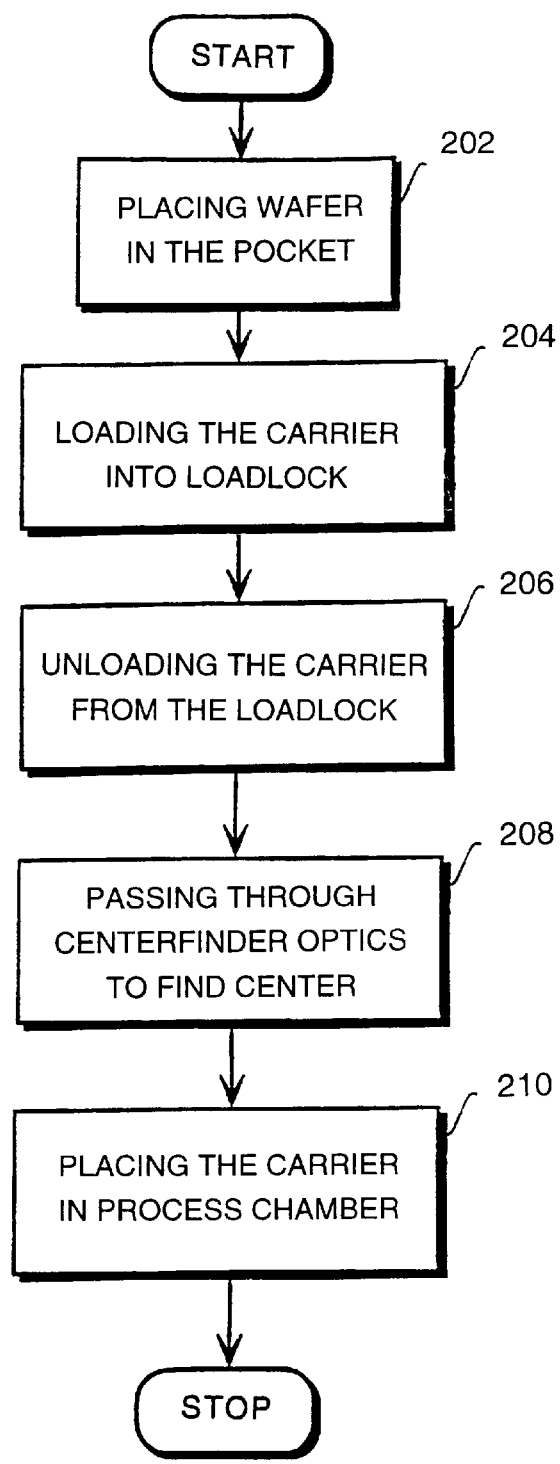
FIG. 2 is a flow chart depicting a process of loading a wafer into the wafer carrier and further into a process chamber for processing or testing in accordance with another aspect.

Further provided herein is a method of processing or testing a wafer for a semiconductor device using the single wafer system described herein. Referring to FIG. 2, a flow chart is given to depict such method. The first step, as set forth in block 202, is to place a single wafer or test chip into the wafer pocket centered on, for example, a silicon carbide disk. This can be done, for example, manually or robotically.

Since wafers having a diameter of 8 inches are commonly used in the semiconductor industry for the manufacture of integrated circuits, the disk herein is made having a diameter of 8 inches. The wafer pocket can be made smaller than 8 inches and centered on the silicon carbide disk, for example, 6 inches. Any wafers or test chips smaller than the standard size of 8" are able to fit in the wafer pocket. Since the disk conforms to a standard wafer diameter and a wafer or test chip of standard size or smaller can be carried in the wafer pocket, the process chamber is wafer size independent and treats the disk like a standard wafer.

This design allows smaller wafers or test chips to run in a standard process chamber without having to reconfigure the process chamber size and robot calibrations, and without sacrificing processing results on the small wafers or test chips. This design also minimizes the need for time-consuming system size reconfigurations, and reduces the chance of contamination by minimizing process chamber and robot exposure to ambient.

The disk may be made of silicon carbide, which is compatible with the gas and temperature environment in a standard process chamber. This allows standard processing to be performed with the disk acting like a standard 8-inch wafer. Thus, the disk can be reused repeatedly in a high temperature and corrosive environment.

Alternatively, the above disclosed silicon carbide disk is coated with a thin polysilicon layer (approximately 5–10 microns). The coated disk responds to the thermal environment in the process chamber in the same way as a standard silicon wafer.

Referring back to FIG. 2, as set forth in block 204, the next step is to load the disk in the loadlock. A typical loadlock chamber has a carrier for holding unprocessed wafers. The unprocessed wafers are then unloaded by a robot and transferred to process chambers. The loadlock chamber is a pressure-tight enclosure which is coupled to the process chamber by interlocking seals which permit the loadlock chamber to be removed and reattached to the process chamber as needed. The load lock chamber allows the process chamber to be protected from ambient conditions.

The following steps, as set forth in blocks 206–210 of FIG. 2, are automated processes for transferring the wafer carrier from the loadlock chamber to a process chamber, including unloading the disk from the loadlock by the robot blade, passing through the centerfinder optics to find the center, and placing the disk into the process chamber.

Alternatively, the wafer carrier disclosed herein could be used to set up a process using inexpensive smaller diameter wafers, or partial wafers where previously only a full sized wafer could be utilized. The need for such a wafer carrier arose as a result of a concern over expensive 300 nm wafers for normal epitaxial process set-up. If 200 mm wafers could be utilized for particle and basic thickness and resistivity tuning, enormous setup cost on 300 mm demonstrations and start-ups could be saved. Additionally, using the wafer carrier disclosed herein, one patterned test wafer could be taken, and several tuning runs could be performed on the same wafer by breaking the wafer and only loading a small test chip for each process iteration. This could allow to set-up a process using fewer actual device wafers.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A wafer carrier comprising:
   a disk formed of a continuous material to the approximate size of a standard wafer substrate used in the manufacture of integrated circuits; and
   a pocket positioned in said disk.

2. The wafer carrier of claim 1, wherein said disk comprises silicon carbide.

3. The wafer carrier of claim 2, wherein said disk is coated with a polysilicon layer.

4. The wafer carrier of claim 3, wherein said polysilicon layer has a thickness of about 5 microns to about 10 microns.

5. A wafer carrier comprising:
   a disk formed of a continuous material having a diameter approximately equal to the diameter of an 8-inch wafer; and
   a pocket positioned in said disk, said pocket having a diameter approximately equal to the diameter of a 6-inch wafer.

6. The wafer carrier of claim 5, wherein said disk comprises silicon carbide.

7. The wafer carrier of claim 6, wherein said disk is coated with a polysilicon layer.

8. The wafer carrier of claim 7, wherein said polysilicon layer has a thickness of about 5 microns to about 10 microns.

9. The wafer carrier of claim 1 wherein the pocket is centered on the disk.

10. The wafer carrier of claim 5 wherein the pocket is centered on the disk.

11. A substrate carrier for holding a substrate, the substrate carrier comprising:
    a disk formed of a continuous material having a top surface and a bottom surface separated by a thickness, wherein the disk is formed to the approximate size of a standard wafer substrate used in the manufacture of integrated circuits; and
    a pocket formed through a top surface of the disk and extending through a portion of the thickness of the disk.

12. The substrate carrier of claim 11, wherein the periphery of the pocket is substantially circular.

13. The substrate carrier of claim 12, wherein the pocket has a diameter approximately equal to the diameter of a 6-inch wafer.

14. The substrate carrier of claim 11, wherein the disk has a diameter approximately equal to the diameter of an 8-inch wafer.

15. The wafer carrier of claim 1, wherein the pocket is structured and arranged to hold a standard wafer substrate used in the manufacture of integrated circuits.

16. The wafer carrier of claim 1, wherein the pocket is structured and arranged to hold a portion of a standard wafer substrate used in the manufacture of integrated circuits.

17. A wafer carrier comprising:
    a disk formed of a continuous material having the approximate diameter of a standard wafer substrate used in the manufacture of integrated circuits; and
    a pocket positioned in said disk.

18. The substrate carrier of claim 17, wherein the pocket is structured and arranged to hold a standard wafer substrate used in the manufacture of integrated circuits.

19. The wafer carrier of claim 17, wherein the pocket is structured and arranged to hold a portion of a standard wafer substrate used in the manufacture of integrated circuits.

20. A substrate carrier for holding a substrate, the substrate carrier comprising:

a disk having a top surface and a bottom surface separated by a thickness; and a pocket formed through a top surface of the disk and extending through a portion of the thickness of the disk, wherein the substrate carrier is a single continuous structure.

21. The substrate carrier of claim 20 wherein the disk comprises silicon carbide.

22. The substrate carrier of claim 21 wherein the disk is coated with a polysilicon layer.

23. The substrate carrier of claim 22 wherein the polysilicon layer has a thickness of about 5 microns to about 10 microns.

24. The substrate carrier of claim 20 wherein the pocket is centered on the disk.

25. The substrate carrier of claim 20 wherein the periphery of the pocket is substantially circular.

26. The substrate carrier of claim 25 wherein the pocket has a diameter approximately equal to the diameter of a 6-inch wafer.

27. The substrate carrier of claim 20 wherein the disk has a diameter approximately equal to the diameter of an 8-inch wafer.

28. A substrate carrier for holding a substrate, the substrate carrier comprising:

a disk having a top surface and a bottom surface separated by a thickness, wherein the disk is formed to the approximate diameter of a standard wafer substrate used in the manufacture of integrated circuits; and a pocket formed through a top surface of the disk and extending through a portion of the thickness of the disk, wherein the substrate carrier is a single continuous structure.

* * * * *